United States Patent
Beau et al.

(10) Patent No.: US 12,263,795 B2
(45) Date of Patent: *Apr. 1, 2025

(54) TRIM ELEMENT COMPRISING A FUNCTIONAL LAYER MADE OF CARBON MATERIAL

(71) Applicant: FAURECIA INTERIEUR INDUSTRIE, Nanterre (FR)

(72) Inventors: Godefroy Beau, La Garenne Colombes (FR); Lionel Hafer, Saint-Jean Rohrbach (FR); Adnen Nouri, Cergy (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 588 days.

This patent is subject to a terminal disclaimer.

(21) Appl. No.: 17/531,198

(22) Filed: Nov. 19, 2021

(65) Prior Publication Data
US 2022/0161741 A1   May 26, 2022

(30) Foreign Application Priority Data
Nov. 20, 2020   (FR) ..................................... 20 11936

(51) Int. Cl.
*B60R 13/02* (2006.01)
*B32B 9/00* (2006.01)
(Continued)

(52) U.S. Cl.
CPC .............. *B60R 13/02* (2013.01); *B32B 9/007* (2013.01); *B32B 9/045* (2013.01);
(Continued)

(58) Field of Classification Search
CPC ............ B60R 13/02; B60R 2013/0287; B60R 13/0243; B60R 13/0256; B60R 13/0262;
(Continued)

(56) References Cited

U.S. PATENT DOCUMENTS

2003/0122794 A1   7/2003   Caldwell
2014/0167910 A1   6/2014   Parola et al.
(Continued)

FOREIGN PATENT DOCUMENTS

EP   2744111 A1   6/2014
FR   3068319 A1   1/2019
WO   03044957 A2   5/2003

OTHER PUBLICATIONS

French Search Report corresponding to French Application No. FR 2011936, dated Aug. 24, 2021, 2 pages.

*Primary Examiner* — Amy Onyekaba
(74) *Attorney, Agent, or Firm* — Reising Ethington P.C.

(57) ABSTRACT

A trim element includes at least one support layer having an inner face and an outer face and at least one functional layer of carbon material extending over at least part of the inner face and/or over at least part of the outer face of the support layer. A part of the functional layer defines a pattern having at least one conductive area of carbon material and at least one non-conductive area formed by a through-opening in the functional layer, the conductive area being powered by a current source electrically connected to the conductive area, the pattern forming at least a part of an electrical circuit arranged to perform a function.

14 Claims, 15 Drawing Sheets

(51) Int. Cl.
  *B32B 9/04* (2006.01)
  *B32B 38/00* (2006.01)
  *G06F 3/041* (2006.01)
  *G06F 3/044* (2006.01)
  *H05K 1/03* (2006.01)
  *H05K 1/09* (2006.01)

(52) U.S. Cl.
  CPC ...... *B32B 38/0004* (2013.01); *G06F 3/04164* (2019.05); *G06F 3/0446* (2019.05); *H05K 1/0366* (2013.01); *H05K 1/09* (2013.01); *B32B 2260/021* (2013.01); *B32B 2260/046* (2013.01); *B32B 2262/06* (2013.01); *B32B 2307/202* (2013.01); *B32B 2457/00* (2013.01); *B60R 2013/0287* (2013.01); *G06F 2203/04102* (2013.01); *G06F 2203/04103* (2013.01); *G06F 2203/04105* (2013.01); *G06F 2203/04107* (2013.01); *H05K 2201/0158* (2013.01)

(58) Field of Classification Search
  CPC ......... B60R 16/02; B32B 9/007; B32B 9/045; B32B 38/0004; B32B 2260/021; B32B 2260/046; B32B 2262/06; B32B 2307/202; B32B 2457/00; B32B 5/26; B32B 9/025; B32B 2262/065; B32B 2262/067; B32B 2262/106; B32B 2307/51; B32B 2457/08; B32B 2457/16; B32B 2457/208; B32B 2605/003; B32B 2605/006; B32B 3/266; B32B 7/12; B32B 27/12; B32B 27/30; B32B 27/302; B32B 27/308; B32B 27/32; B32B 27/365; B32B 5/08; G06F 3/04164; G06F 3/0446; G06F 2203/04102; G06F 2203/04103; G06F 2203/04105; G06F 2203/04107; H05K 1/0366; H05K 1/09; H05K 2201/0158; H05K 1/18

See application file for complete search history.

(56) References Cited

U.S. PATENT DOCUMENTS

| | | | |
|---|---|---|---|
| 2017/0108960 A1* | 4/2017 | Lee | G06F 3/041 |
| 2020/0324621 A1* | 10/2020 | Song | B60H 1/2226 |
| 2021/0283988 A1* | 9/2021 | De Pelsemaeker | B60H 1/2215 |
| 2021/0323270 A1* | 10/2021 | Weikel | B60K 35/00 |
| 2022/0039214 A1* | 2/2022 | Chung | B60H 1/2227 |
| 2022/0363190 A1* | 11/2022 | Vanluchene | B60Q 3/54 |
| 2023/0011608 A1* | 1/2023 | Vanluchene | B32B 3/263 |

* cited by examiner

TRIM ELEMENT COMPRISING A FUNCTIONAL LAYER MADE OF CARBON MATERIAL

TECHNICAL FIELD

The present invention relates to a trim element of the type comprising at least one support layer, comprising an inner face and an outer face, and at least one functional layer of carbon material extending over at least part of the inner face and/or over at least part of the outer face of the support layer.

The invention further relates to a method for producing such a trim element.

The invention applies, for example, to a trim element forming a door panel, a centre console cover, a vehicle dashboard cover or the like.

BACKGROUND

In such a trim element, it is desirable to integrate some functionality for the vehicle occupants on the outer surface of the trim element. For example, the trim element may include tactile surfaces to enable certain vehicle functions to be controlled, sensing surfaces to detect contact with the outer surface or the like.

The functional elements for carrying out these functions, such as printed circuit boards, are integrated into the trim element, for example under a decorative layer so that they are not visible from the vehicle interior. For example, the circuits are glued to the support layer before the decorative layer is applied to the support layer. However, such a process is time-consuming and can be complicated, especially when several functional surfaces are provided, in which case various functional elements have to be attached at different points of the support layer. In addition, if the functional element(s) is (are) incorrectly positioned on the support layer and/or in relation to the decorative layer, the quality of the trim element is degraded because the functional surfaces do not extend exactly opposite the indications provided on the outer surface of the trim element to indicate their presence and/or their area of activation.

SUMMARY

One of the aims of the invention is to overcome these disadvantages by providing a trim element comprising one or more functional surfaces that can be produced in a simple, reliable manner.

To this end, the invention relates to a trim element of the aforesaid type, wherein at least part of said functional layer defines at least one pattern comprising at least one conductive area of carbon material and at least one non-conductive area formed by an opening extending through the functional layer, said conductive area being powered by a current source electrically connected to the conductive area, the pattern forming at least part of an electrical circuit arranged to perform a function of interacting with a passenger of the vehicle on an outer surface of the trim element.

By making the pattern in a functional layer made of carbon material, a functional electrical circuit can be defined at a specific location on the support layer in a simple, reliable way. In addition, where multiple functional electrical circuits are provided, they can all be implemented in the functional layer(s), thereby reducing the operations involved in implementing the trim element and simplifying the relative positioning of the different functional electrical circuits on the support layer.

According to other optional features of the trim element according to the invention, taken alone or in any technically feasible combination:

- the trim element comprises a decorative layer extending opposite the outer face of the support layer and forming the outer surface of the trim element;
- the outer surface of the trim element is formed by the support layer and/or the functional layer;
- the trim element comprises an outer functional layer extending over at least part of the outer face of the support layer and an inner functional layer extending over at least part of the inner face of the support layer, the patterns of the outer and inner functional layers forming a capacitive circuit so as to form a tactile surface on at least part of the outer surface of the trim element;
- the pattern of the functional layer forms a flexible resistive circuit so as to form a pressure sensor on at least part of the outer surface of the trim element;
- the trim element comprises an outer functional layer and an inner functional layer, the outer functional layer being separated from the inner functional layer by the support layer or by a flexible layer, the patterns of the outer functional layer and the inner functional layer forming a capacitive circuit whose capacitance varies according to the distance between the outer functional layer and the inner functional layer, said distance varying by reversible compression of the support layer or the flexible layer when pressure is exerted on the outer surface of the trim element;
- the support layer is made of a composite material comprising natural fibres in a polypropylene matrix;
- the pattern is formed in a functional layer extending on the outer face of the support layer, said pattern forming a functional part of an electrical circuit, said electrical circuit comprising a power supply part extending on the inner face of the support layer, said power supply part being electrically connected to the power source and to the functional part of the electrical circuit through the support layer;
- the power supply part is electrically connected to the functional part by at least one connecting element extending into the support layer, said connecting element being formed by a conductive material extending into a through opening formed in the support layer;
- the functional layer forms a grounding area outside the pattern arranged to protect the electrical circuit formed by the pattern and/or another electrical circuit of the trim element from electrostatic discharge; and
- the functional layer is formed by a film bonded or laminated to at least part of the inner face and/or at least part of the outer face of the support layer.

According to another aspect, the invention relates to a method of making a trim element as described above, comprising the following steps:

- providing a support layer,
- applying a layer of carbon material to at least part of the outer face and/or at least part of the inner face of the support layer,
- cutting the layer of carbon material through its entire thickness so as to form a pattern comprising at least one conductive area of carbon material and at least one non-conductive area formed by a through opening in the layer of carbon material so as to obtain an electrical circuit,
- electrically connecting the conductive area of the reinforcing layer pattern to a power source.

The method according to the invention may further comprise the following features, taken alone or in any combination that is technically possible:
- the carbon material layer is cut by laser etching, chemical etching, milling or mechanical drilling into the carbon material,
- the pattern in the carbon material layer is made before and/or after the application of the carbon material layer to the support layer.

BRIEF DESCRIPTION OF THE DRAWINGS

Other aspects and advantages of the invention will become apparent upon reading the following description, given as an example and referencing the attached drawings, in which.

DETAILED DESCRIPTION

Figure 1:
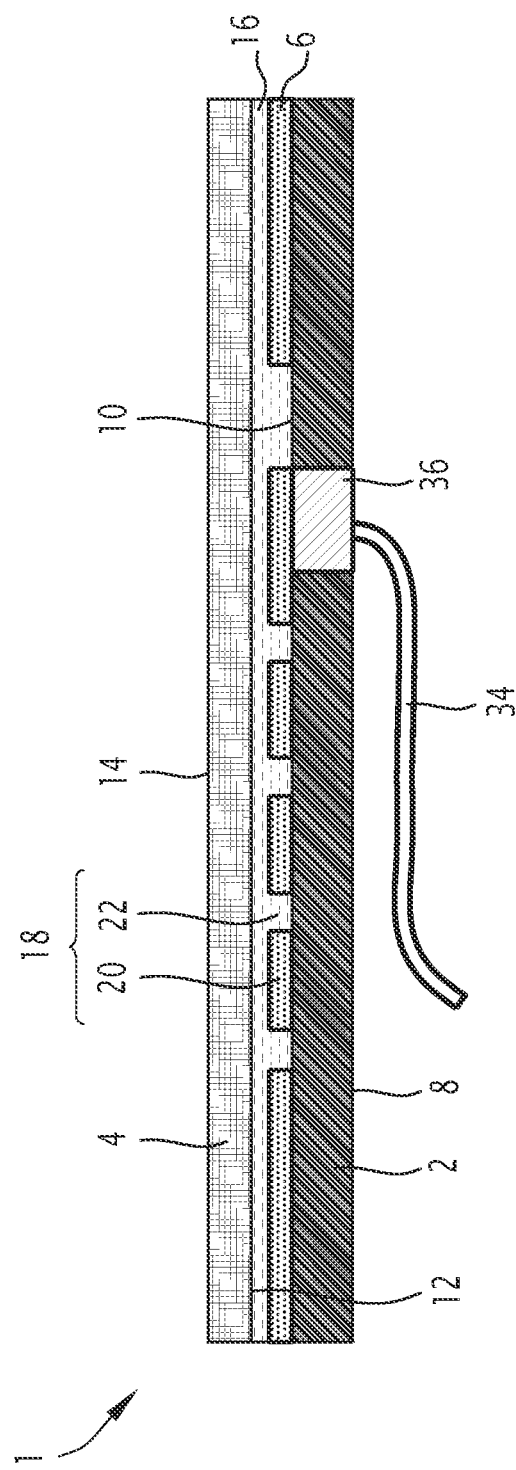
FIG. 1 is a schematic cross-sectional representation of a portion of a functional element according to one embodiment of the invention.
Figure 2:
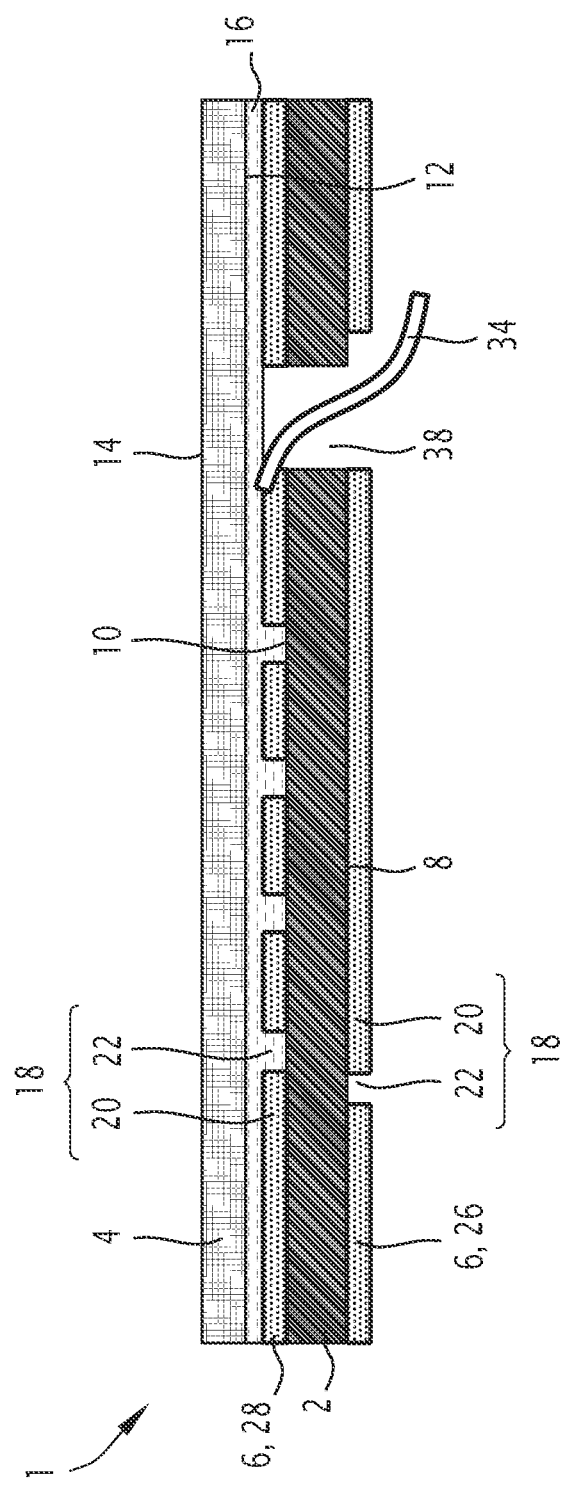
FIG. 2 is a schematic cross-sectional representation of a portion of a functional element according to another embodiment of the invention.
Figure 3:
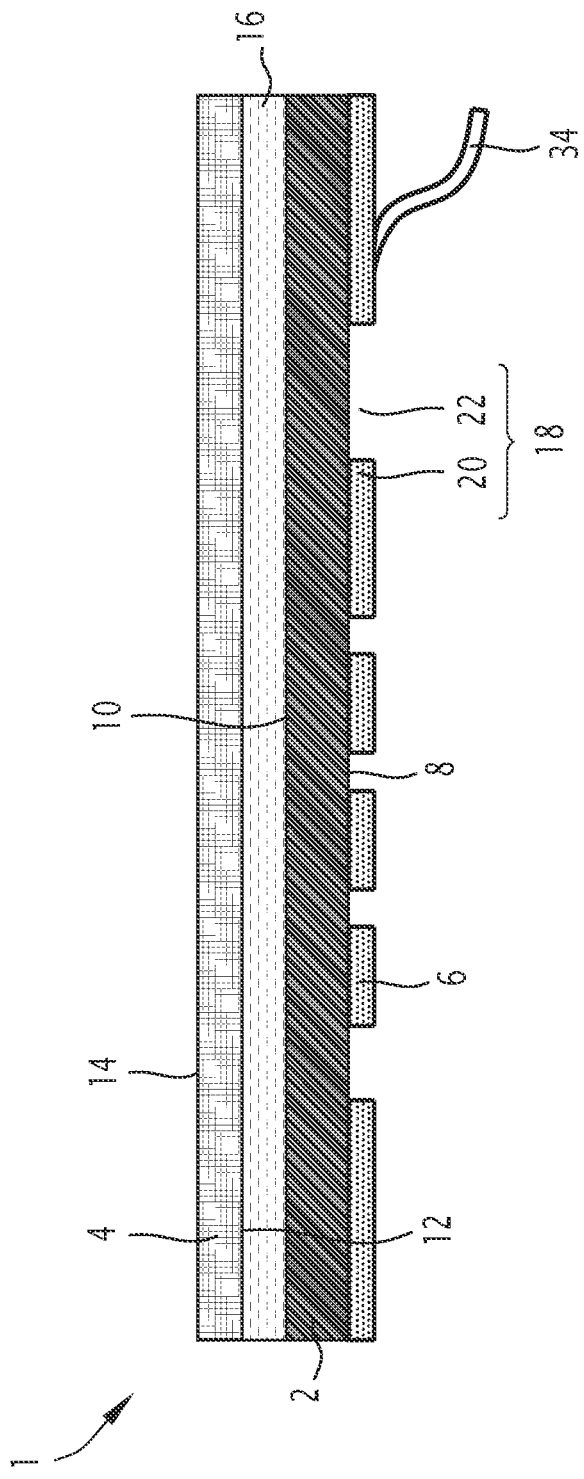
FIG. 3 is a schematic cross-sectional representation of a portion of a functional element according to yet another embodiment of the invention.

With reference to FIGS. 1 to 3, a vehicle trim element 1 comprising at least a support layer 2, a decorative layer 4 and a functional layer 6 is described. Such a trim element is intended, for example, to form a door panel, a dashboard or centre console cover or the like.

The support layer 2 is arranged to impart its shape and mechanical characteristics to the trim element 1, in particular its rigidity. The support layer 2 is thus for example made of a substantially rigid material for a door panel, such as a plastic or composite material. In one embodiment, the support layer 2 is made of a composite material comprising natural fibres in a polypropylene matrix, also known as NFPP for "Natural Fibre PolyPropylene". The natural fibres are, for example, selected from flax, hemp, kenaf and/or wood. The support layer 2 is formed, for example, by thermo-compression in a pressing tool with the desired shape of the support layer 2, which corresponds to the shape of the trim element 1. Thus, the support layer 2 has, for example, a three-dimensional shape with raised areas. By way of example, the support layer 2 may for example comprise an area projecting from the rest of the support layer 2 to form an armrest.

Alternatively, the support layer 2 is made by injecting plastic material, such as polypropylene (PP), polycarbonate acrylonitrile butadiene styrene (PC ABS), or the like, into a mould cavity of the desired shape. According to another embodiment, the support layer 2 is obtained by additive manufacturing to the desired shape. The support layer 2 comprises an inner face 8, intended to extend on the face of the part of the vehicle on which the trim element is to be installed, such as the vehicle door in the case of a door panel, and an outer face 10, opposite the inner face 8, intended to face the vehicle interior.

The decorative layer 4 extends on the outer face 10 of the support layer 2 over at least a part thereof. The decorative layer 4 is arranged to impart its look and feel to the trim element 1. The decorative layer 4 is thus, for example, made of a flexible or rigid material, with a particular look and/or feel that it is desired to give to the trim element 1. For example, the decorative layer 4 is made of textile material, plastic material, wood material, leather or imitation leather or the like. The decorative layer 4 is contoured to the outer face 10 of the support layer 2, i.e. it substantially conforms to the shape of the outer face 10 in the area of the support layer 2 that it covers. In one embodiment, the decorative layer 4 covers the entire support layer 2.

The decorative layer 4 comprises an inner face 12 extending opposite the outer face 10 of the support layer 2 and an outer face 14 extending outwards from the trim element 1 and forming the outer surface of the trim element 1, i.e. forming the part of the trim element 1 visible from the vehicle interior. The outer face 14 may include decorative patterns or indications to a user of the presence of a functional area for example, as will be described later. Alternatively or additionally, the decorative layer 4 may be translucent, at least in some areas, to allow light to pass from the inner face 12 to the outer face 14, allowing these areas to be backlit to inform a user of the presence of a functional area, for example.

In one embodiment, the decorative layer 4 is secured directly to the support layer 2 (FIGS. 3 and 6), in which case a bonding layer 16, e.g. glue, adhesive, heat-activated polypropylene film, extends between the outer face 10 of the support layer 2 and the inner face 12 of the decorative layer 4. Alternatively, a functional layer 6 is interposed between the support layer 2 and the decorative layer 4, in which case a bonding layer 16 extends between the functional layer 6 and the inner face of the decorative layer 4 (FIGS. 1 and 2). It is understood that the decorative layer 4 can be attached to the support layer 2 or the functional layer 6 in another suitable way. Such attachment can for example be obtained by sewing, overmoulding, welding or foaming a bonding layer, in particular depending on the materials used to make the support layer 2 and/or the decorative layer 4.

According to one embodiment, the trim element 1 is devoid of a decorative layer 4 and the outer surface 14 of the trim element is formed by the outer face of the support layer 2 and/or by the functional layer 6 extending over the support layer 2.

The functional layer 6 is a layer made of a carbon material and comprising at least one pattern 18 enabling the functional layer to impart a particular functionality to the trim element 1, as will be described later. The material is, for example, in the form of carbon fibres without sizing and/or recycled carbon fibres. Not having a sizing improves the electrical properties of the pattern 18. The pattern 18 thus has improved conductivity and electrical contact continuity after the three-dimensional shaping of the trim element, as will be described later. The functional layer 6 has, for example, a thickness of between 20 μm and 200 μm. In addition, the carbon layer may also comprise polypropylene, for example in an amount of 40% or less by weight of the functional layer composition.

In one embodiment, the functional layer 6 is arranged to form a reinforcing layer for the support layer 2. Such a reinforcing layer improves the mechanical properties of the trim element, particularly in terms of stiffness and self-support, especially when the support layer 2 is made of a composite material. In one embodiment, the functional layer 6 is formed by a film bonded or laminated to the support layer 2. In this case, the functional layer does not necessarily form a reinforcing layer for the support layer 2.

The functional layer 6 extends over at least part of the inner face 8 or at least part of the outer face 10 of the support layer 2 depending on the function to be performed, as will be described later. In the case of a reinforcing layer, the functional layer 6 is applied in particular to areas of the support layer 2 that need to be reinforced. According to one embodiment, the functional layer 6 extends over the entire surface of the inner face 8 or the outer face 10 of the support layer. In one embodiment, the functional layer 6 is applied directly to the support layer 2, i.e. there is no intermediate layer between the support layer 2 and the functional layer 6. The functional layer 6 is contoured to the part of the face of the support layer 2 that it covers, i.e. the reinforcing layer 6 conforms to the shape of that part of the face of the support layer 2.

The pattern 18 comprises at least one conductive area 20 formed by the carbon material of the functional layer 6 and at least one non-conductive area 22 formed by a through opening in the functional layer 6. The shapes of the conductive area 20 and the non-conductive area 22, examples of which are shown in FIGS. 7 to 12, are arranged to form at least part of a functional electrical circuit performing a particular function when electricity is supplied to the conductive area 20. In other words, the pattern 18 is such that the functional layer 6 defines at least one electrical circuit to perform the desired function when the circuit is powered. Depending on the desired function, several separate conductive areas 20 and non-conductive areas 22 can be provided. Generally, the pattern 18 comprises a non-conductive area 22 surrounding the conductive area(s) 20 to isolate the electrical circuit from the rest of the functional layer 6.

The functions performed by the electrical circuit(s) are functions of interaction with a vehicle passenger on the outer surface 14 of the trim element. In other words, the functions performed form part of the vehicle's human-machine interface, with vehicle passengers being able to interact with the outer surface 14 of the trim element to activate, control and/or influence the function performed by the electrical circuit formed by the pattern 18.

According to the embodiment shown in FIG. 1, the pattern 18 is arranged to form an electrical circuit on the outer face 10 of the support layer 2, between that layer and the decorative layer 4, for example a resistive circuit as will be described later.

Figure 14:
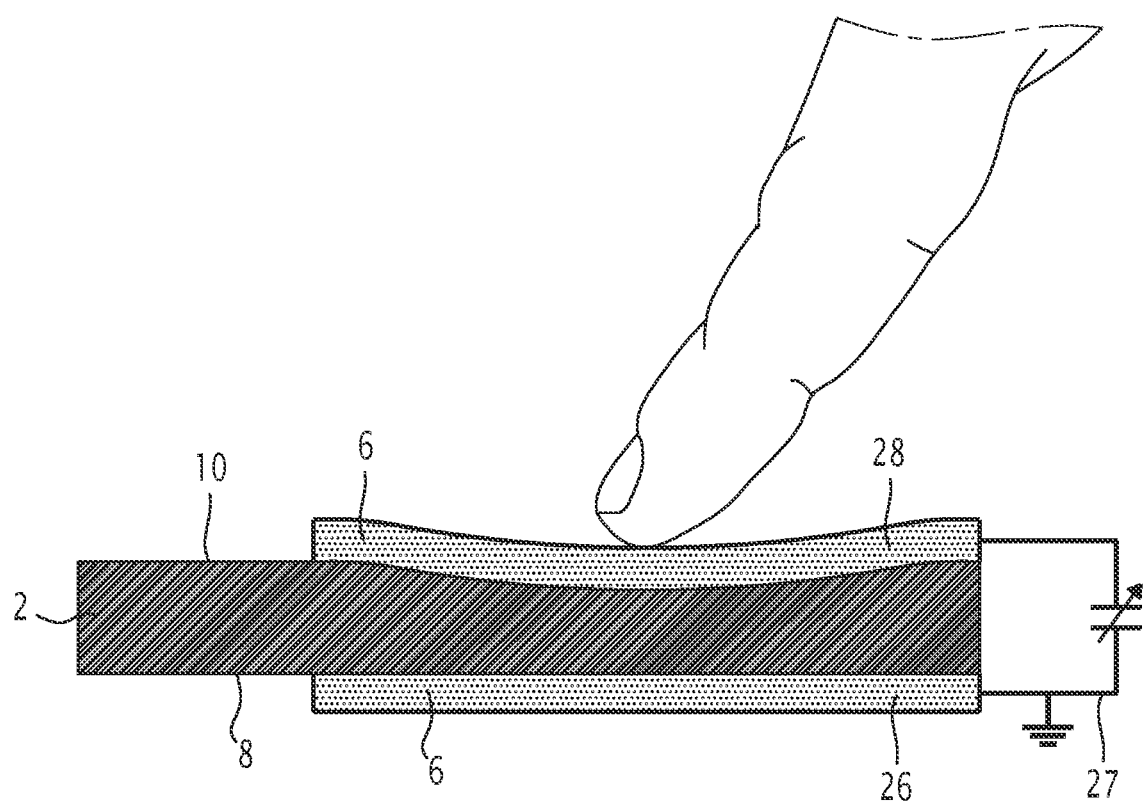
FIG. 14 is a schematic cross-sectional representation of a trim element comprising a pressure sensor in one embodiment.

In the embodiment shown in FIGS. 2 and 14, the pattern 18 is arranged to form a capacitive circuit with a further pattern extending on the opposite face of the support element 2. In this case, the trim element comprises a second functional layer 6 whose pattern 18 forms a capacitive circuit with the pattern 18 of the first functional layer 6. More particularly, the trim element 1 comprises an inner functional layer 26 extending over at least part of the inner face 8 of the support layer 2 and an outer functional layer 28 extending over at least part of the outer face 10 of the support layer 2, the pattern 18 of the inner functional layer 26 and the pattern 18 of the outer functional layer 28 extending opposite each other. The shape of the patterns 18 is arranged so that the capacitive circuit generates a capacitive field towards the outer surface 14 of the trim element 1 when the patterns are energised. Thus, the patterns 18 of the inner functional layer 26 and the outer functional layer 28 form a tactile surface on the outer surface 14 of the trim element opposite the pattern 18 of the outer functional layer 28. Such a touch surface can be used to control the operation of certain vehicle functions, such as the operation of a window pane in the case of a door panel, when a user touches the touch surface or other setting. It is understood that when two functional layers 6 are provided on opposite faces of the support layer 2, they do not necessarily have the same dimensions. In particular, the dimensions of one of the two functional layers may be limited to those strictly necessary to form the pattern 18 opposite the pattern 18 formed in the other functional layer.

According to the embodiment of FIG. 14, the support layer 2 is flexible and is able to be compressed when pressure is exerted on the outer surface of the trim element 1, for example by a finger as shown in FIG. 14. The compression is reversible, i.e. the support layer 2 is elastically deformable when the pressure is released. In this embodiment, the patterns 18 on the inner functional layer 26 and the outer functional layer 28 form a capacitive circuit 27 whose capacitance varies with the distance between the inner functional layer 26 and the outer functional layer 28. Thus, by compressing the support layer 2 in the area of the patterns 18, the patterns are brought closer to each other, thus varying the capacitance of the capacitive circuit 27 and enabling a force sensor to be made in the trim element. The force with which pressure is exerted can be determined by measuring the capacitance of the capacitive circuit 27, which increases as the distance between the patterns decreases, i.e. as the force exerted on the outer surface 14 increases.

Figure 15:
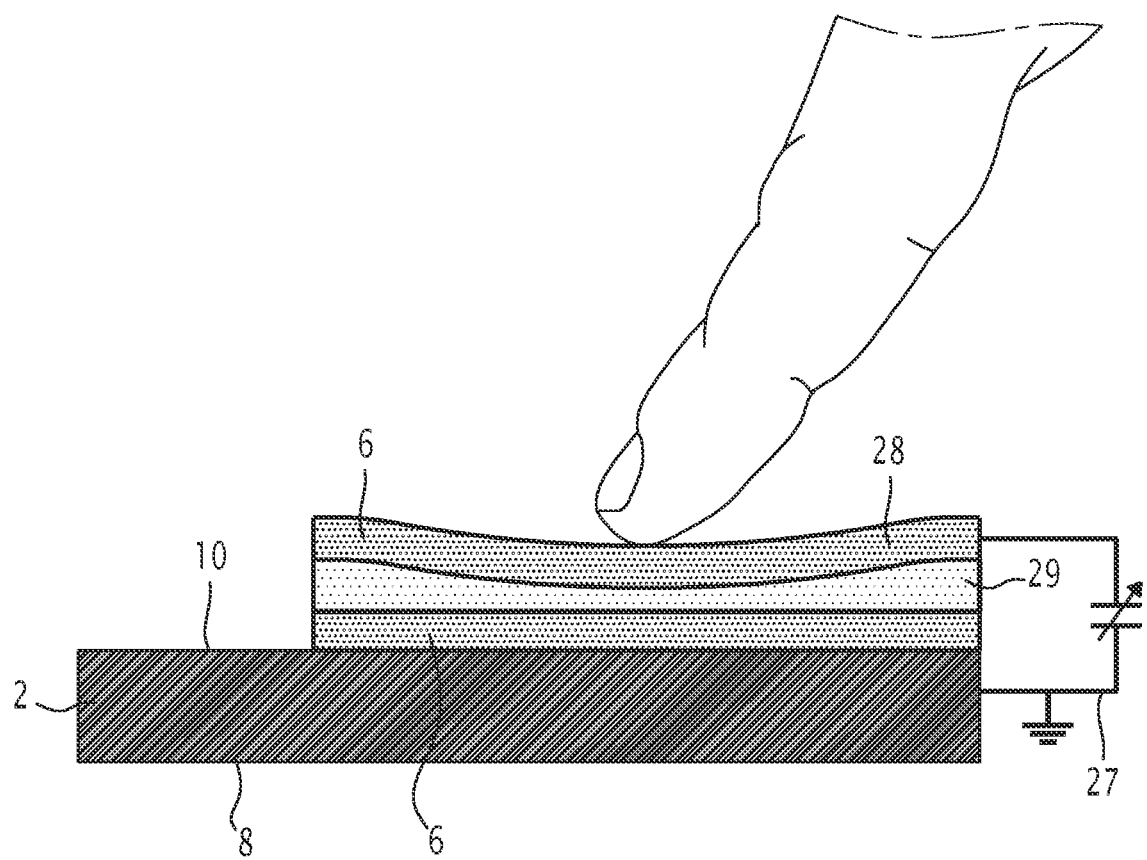
FIG. 15 is a schematic cross-sectional representation of a trim element comprising a pressure sensor in another embodiment.

Alternatively, the force transducer may be formed by two functional layers 6 extending over the outer face 10 of the support layer 2 and separated by a flexible layer 29 as shown in FIG. 15. In this case, it is the flexible layer 29 which is elastically deformable so as to allow the patterns 18 of the two functional layers 6 to be brought together when pressure is applied to the outer surface 14 of the trim element to vary the capacitance of a capacitive circuit 27 formed between the two functional layers 6. The flexible layer 29 is for example a layer of foam and/or a layer of adhesive material. The flexible layer 29 electrically insulates the two functional layers 6.

Figure 9:
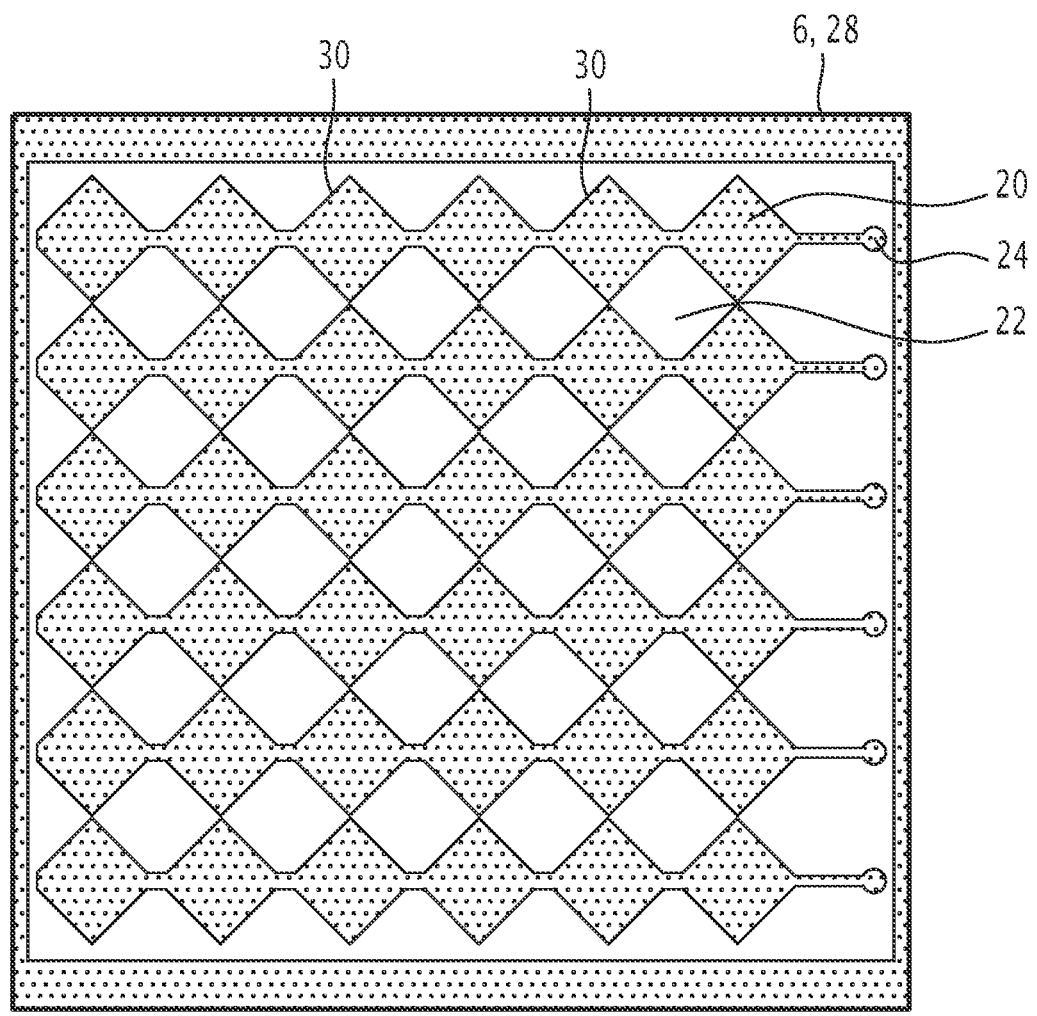
FIG. 9 is a schematic representation of another example of a pattern made in a functional layer of a trim element to form part of a capacitive circuit.
Figure 10:
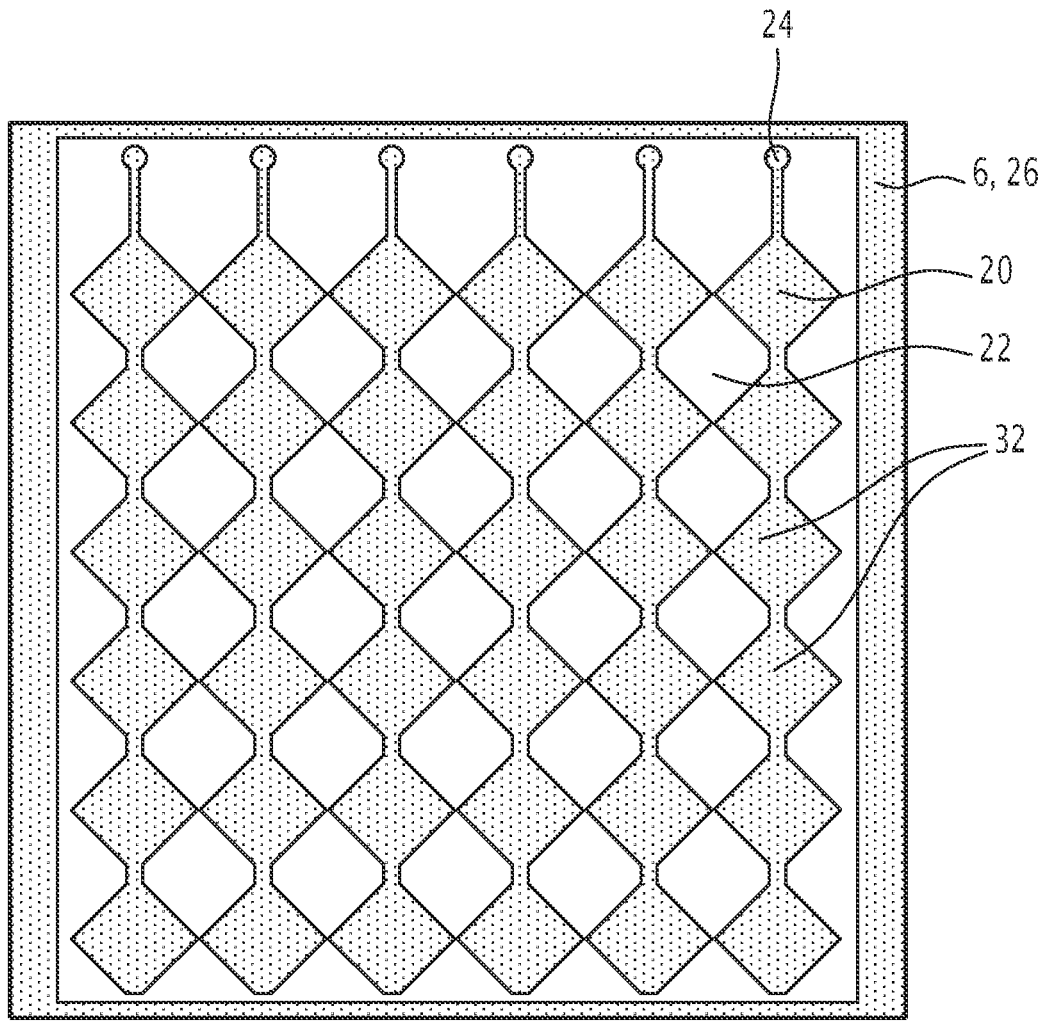
FIG. 10 is a schematic representation of another example of a pattern made in a functional layer of a trim element to form another part of a capacitive circuit.
Figure 11:
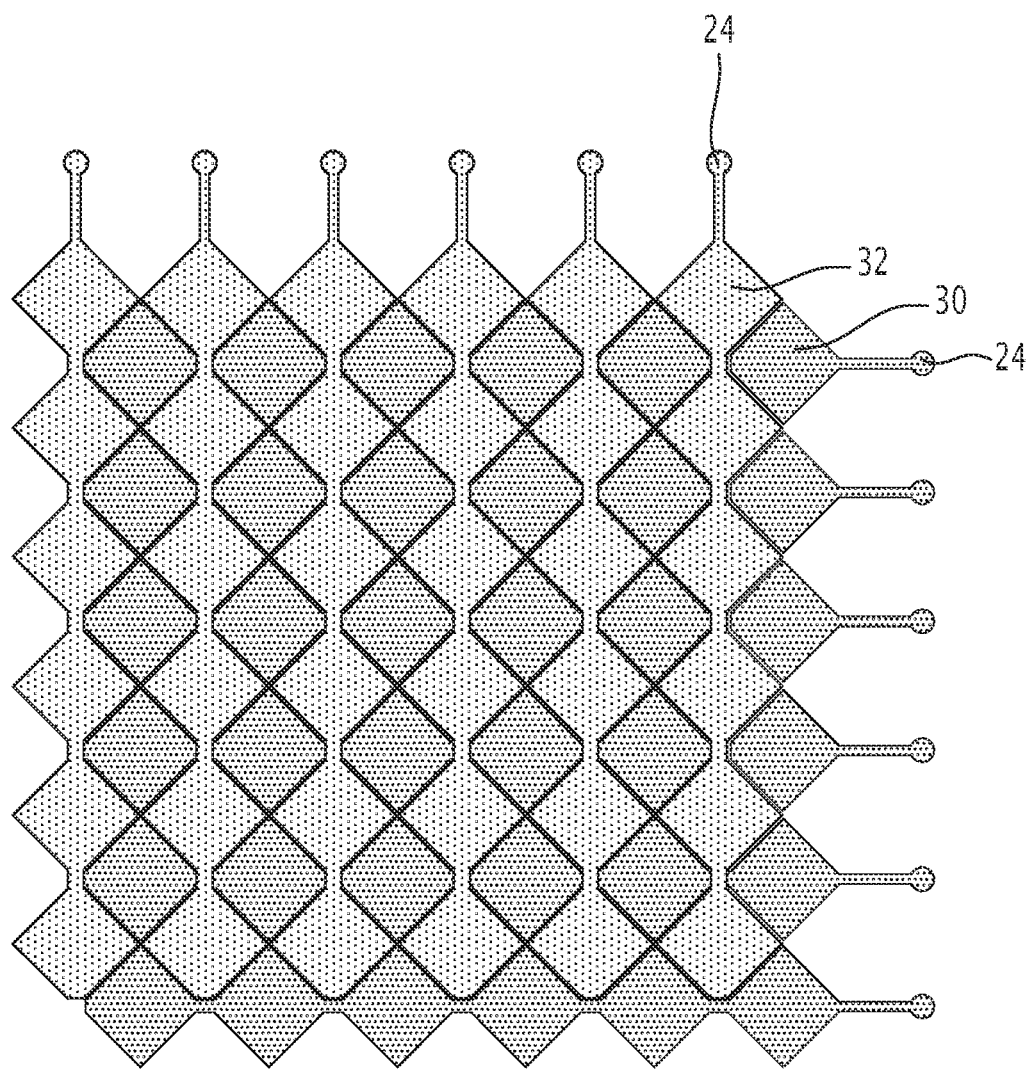
FIG. 11 is a schematic representation of the capacitive circuit formed by the patterns in FIGS. 9 and 10.

An example of a pattern shape 18 for making a multi-touch capacitive circuit is shown in FIGS. 9 to 11. In FIG. 9, the pattern 18 formed in the outer functional layer 28 is shown. The pattern 18 comprises a plurality of substantially parallel rows of conductive areas 20 separated by rows of non-conductive areas 22. Each conductive area 20 is formed by a succession of pads 30 connected in series and linked to a terminal 24. In FIG. 10, the pattern 18 formed in the inner functional layer 26 is shown. The pattern 18 comprises a plurality of substantially parallel columns of conductive areas 20 separated by columns of non-conductive areas 22. Each conductive area 20 is formed by a succession of pads 32 connected in series and linked to a terminal 24. FIG. 11 depicts the capacitive circuit formed by the patterns 18 in FIGS. 9 and 10. The pattern 18 of the inner functional layer 26 is arranged on the inner face 8 of the support layer 2 in such a way that the pads 32 extend opposite the through openings of the non-conductive areas 22 of the pattern 18 of the outer layer 28 which is arranged on the outer face 10 of the support layer 2. The capacitive circuit thus has a chequerboard shape with cells of one colour extending on one face of the support layer 2 and cells of the other colour extending on the other face of the support layer 2.

Figure 8:
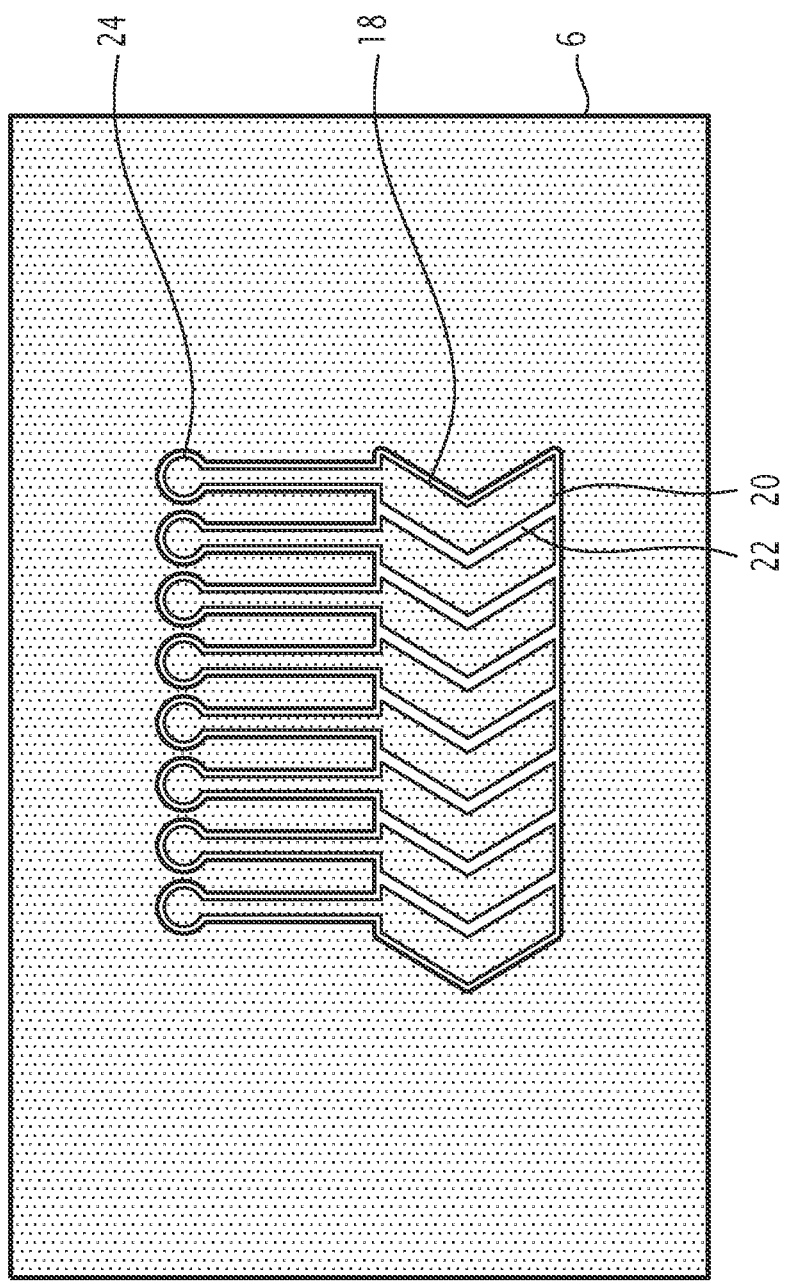
FIG. 8 is a schematic representation of another example of a pattern made in a functional layer of a trim element to form a tactile surface.

Alternatively, according to the example pattern 18 shown in FIG. 8, a capacitive circuit formed on a single face of the support layer 2 may be made to form a so-called "touch slider" on the outer surface 14 of the trim element. This pattern 18 extends, for example, over the outer face 10 of the support layer 2 only. It comprises a row of conductive areas 20, each connected to a terminal 24 and having an arrowhead shape. The conductive areas 20 are separated by non-conductive areas 22 which are also arrowhead-shaped and delimit the conductive areas 20. Such a tactile surface is for example used by sliding the finger along the row, for example to change the value of a parameter controlled by a user, such as temperature, sound volume, ventilation rate, window opening or the like.

Figure 12:
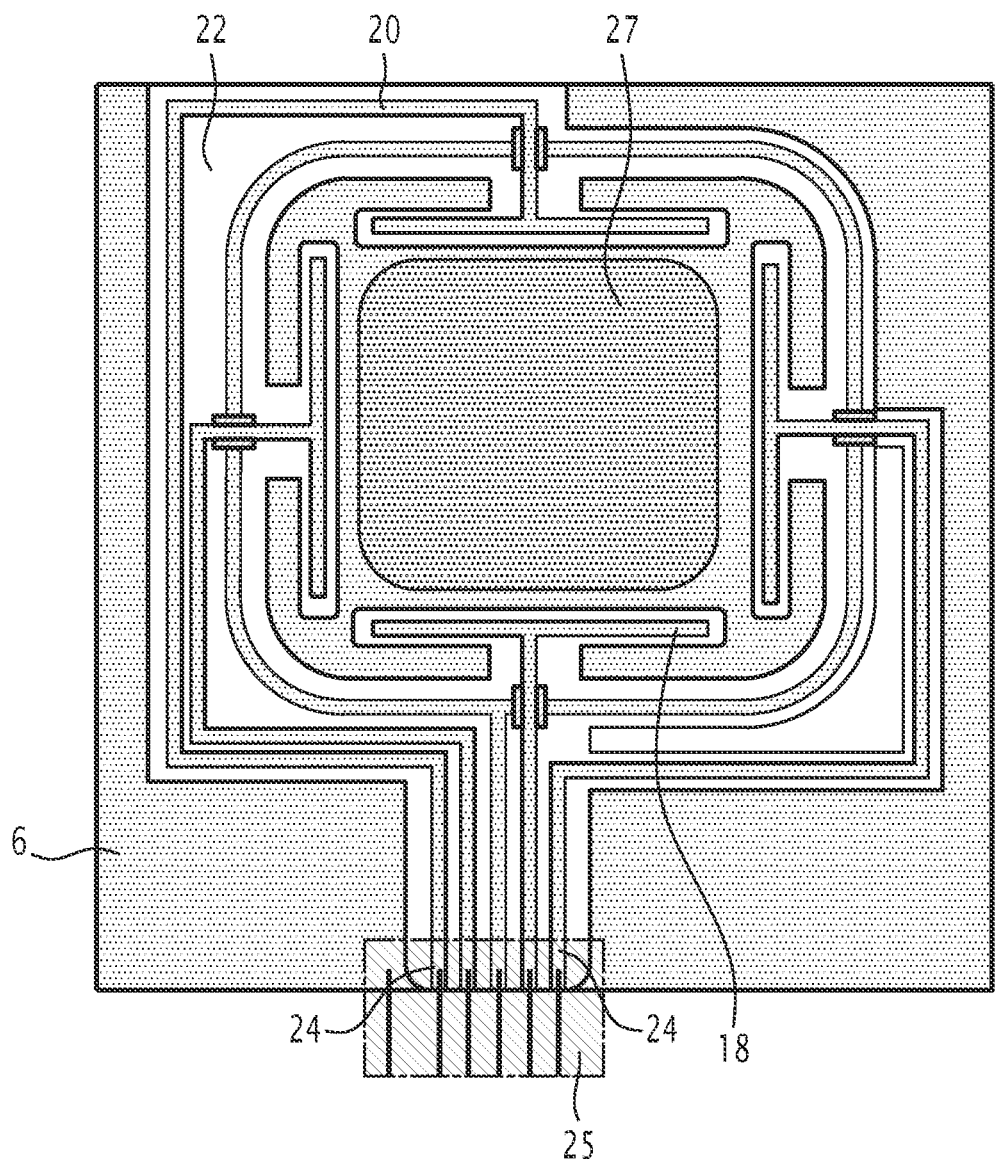
FIG. 12 is a schematic representation of a plurality of patterns made in a functional layer of a trim element to perform several functions on the outer surface of the trim element.
Figure 13:
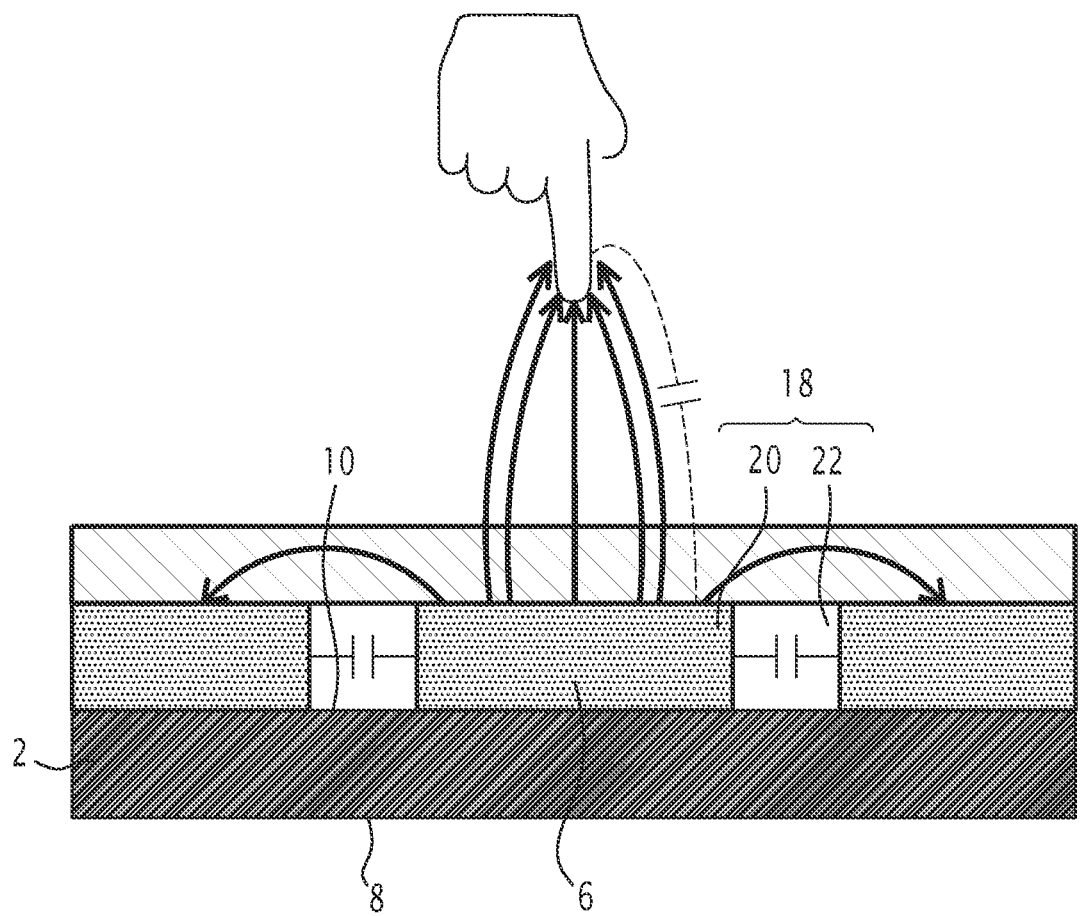
FIG. 13 is a schematic cross-sectional representation of the operation of a pattern in a functional layer forming a capacitive circuit to form a proximity sensor.

In FIG. 12, a pattern 18 forming a proximity sensor around the outer surface 14 of the trim element is shown. Such a pattern 18 comprises a plurality of conductive areas 20 formed by separate tracks separated by non-conductive areas 22. The tracks are each connected to a connector 25 at their end, forming a connection terminal 24. Such a proximity sensor can detect the presence of a part of a passenger's body, such as a hand or finger, in an area around the outer surface 14 of the trim element 1, in order to detect the movements of that part of the body in the detection area. According to the embodiment of FIG. 12, the pattern 18 surrounds a central area 27 which can be used to form a further electrical circuit performing a different function, such as the functions described above, and/or to receive a display device, enabling information to be displayed on the outer surface 14 of the trim element 1, or be left as it is. The pattern 18 is surrounded by the rest of the reinforcing layer 6 which can be connected to the connector 25 to ground the electrical circuits, as will be described later. As shown in FIG. 13, when a user moves a finger to the outer surface 14 of the trim element 1 in the vicinity of the proximity sensor, the capacitance of the capacitive circuit forming this sensor increases and by measuring this capacitance it is possible to determine the presence of the finger in the detection area and the distance of the finger from the outer surface 14 of the trim element.

Figure 7:
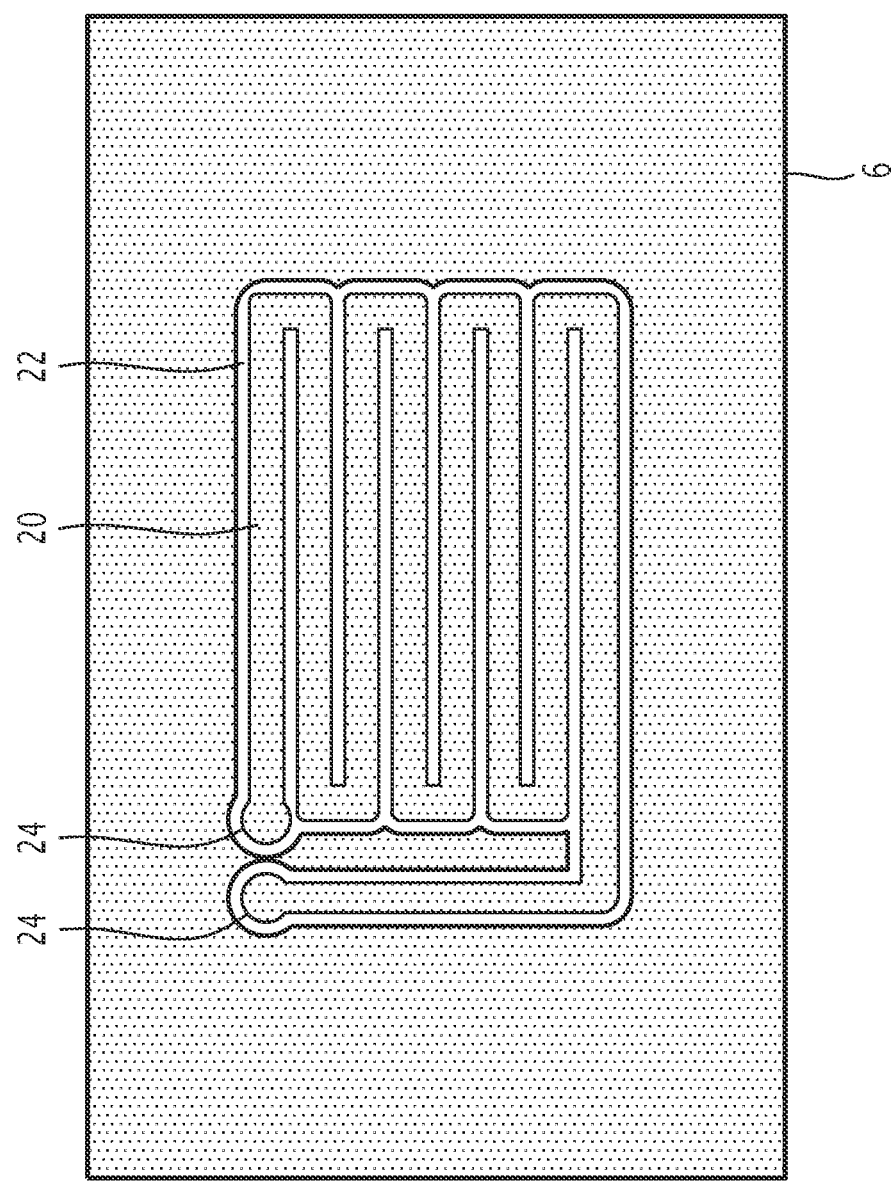
FIG. 7 is a schematic representation of another example of a pattern made in a functional layer of a trim element to form a force sensor.

In the embodiment shown in FIG. 3, the pattern 18 is arranged to form a flexible resistive circuit. In this case, the functional layer 6 extends over the inner face 8 of the support layer 2. By flexible, it is meant that the resistive circuit is capable of deforming when pressure is applied to the outer surface 14 of the trim element, this deformation changing a characteristic value of the circuit so as to allow detection of a pressure on the outer surface 14. Thus, the pattern 18 forms a pressure sensor on a portion of the outer surface 14 of the trim element facing the pattern 18. Such a sensor can, for example, be used to control the operation of certain vehicle functions, for example by forming a switch or a continuous force sensor. If necessary, the decorative layer 4 is applied directly to the outer face 10 of the support layer 2. One form of pattern 18 for making such a load cell, or force gauge, is shown in FIG. 7. The pattern 18 comprises a conductive area 20 extending between two terminals 24, in the form of a strip following a particular path. The strip is bounded by a non-conductive area 22. Alternatively, the pattern performs the function of an on/off switch or button or a force-proportional sensor, depending on, for example, the device controlled by this circuit.

It is understood that a single functional layer 6 or two functional layers on each face may comprise a plurality of patterns 18 in different areas in order to perform different functions on the corresponding different areas of the outer surface 14 of the trim element 1. Thus, for example, a pattern 18 forming a resistive heating circuit is provided on the outer face 10 of the support layer 2 in a first area and a further pattern 18 forming a pressure sensor is provided on the inner face 8 of the support layer 2 in a second area, the pressure sensor enabling, for example, the controlling of the heating surface. Alternatively, several separate patterns forming separate electrical circuits are provided, for example. In some cases, the functions have been described with reference to a particular positioning of the functional layer on one face of the support layer 2. However, it is understood that the same functions could be achieved by placing the functional layer 6 on the other face of the support layer 2.

The or each pattern 18 is supplied with electricity by at least one power source (not shown) electrically connected to the conductive area(s) 20 of the pattern 18, for example connected to each terminal 24 of the patterns 18. The current source is connected to the conductive area 20 for example by a directly connected electrical cable 34 (FIGS. 2 and 3) or via an electrical connector 36 to the conductive area 20 of the pattern 18 (FIG. 1). When the pattern 18 extends over the outer face 10 of the support layer 2, the electrical cable 34 runs for example through a through-opening 38 in the support layer 2, the conductive area 20 of the pattern 18 extending for example over or around a portion of the through-opening 38. Where a connector 36 is provided, this extends, for example, into the through-opening 38 from the inner face 8 to the outer face 10 of the support layer 2, as shown in FIG. 1. The electrical cable 34 is then connected to the electrical connector 36 on the inner face 8 of the support layer 2 and the electrical connector 36 is connected to the conductive area 20 on the outer face 10 of the support layer 2. The electrical cable 34 is for example connected to the vehicle's electrical system which then forms the power source. Where a functional layer 6 is provided on each side of the support layer 2, each functional layer 6 is supplied with power by one or more power sources.

Alternatively, not shown, the pattern 18 forms a functional part of an electrical circuit on one face of the support layer 2, for example the outer face 10. The electrical circuit then comprises a power supply part extending over the other face of the support layer 2, for example the inner face 8. The functional part has the desired shape for the electrical circuit to perform the desired function, as described above, and the power supply part comprises the connection terminals 24 of the circuit which are electrically connected to the power source. The power supply part is electrically connected to the functional part by at least one connecting element extending into the support layer 2. The connection element is, for example, formed by a conductive material filling an opening through the support layer 2 between the supply part and the functional part of the circuit. The feed portion may be formed by a pattern extending into a functional layer 6 extending on the other face of the support layer 2. Alternatively, where only a functional layer 6 is provided, only the tracks forming the feed portion may be formed of carbon material on the other face of the support layer 2. Such an embodiment may facilitate the connection of the electrical circuit to the current source when the circuit extends mainly on one face of the support layer 2 while the current source is arranged on the other face of the support layer 2.

As previously mentioned, the functional layer 6 may form a grounding area outside the pattern(s) 18 formed in the functional layer 6. Such a ground area helps protect the electrical circuit(s) from electrostatic discharges that could damage the electrical circuit(s). For this purpose, the grounding area is electrically connected to the electrical circuit(s), for example at a connector, as shown in FIG. 12. Alternatively or additionally, the functional layer 6 allows the grounding of one or more electrical circuits of the trim element 1 separate from the circuit(s) formed in the functional layer 6. Thus, the circuit(s) provided on a printed circuit board can be protected from electrostatic discharge by connecting the grounding output of the printed circuit board to the grounding area of the functional layer 6.

According to a particular embodiment, the trim element may comprise a transparent or translucent coating extending over the decorative layer 4 or the support layer and/or the functional layer 6, through which the decorative layer 4 or the support layer and/or the functional layer 6 is visible. Such a coating is, for example, a varnish or a translucent film, for example based on polypropylene, which protects the decorative layer 4 or the support layer 2 and/or the functional layer, and in particular avoids the degradation of the pattern(s) 18.

The above-described trim element allows one or more functions to be integrated into the surface of the trim element in a simple, reliable and cost-effective manner by integrating the electrical circuit(s) for performing these functions into a functional layer 6 of the support layer 2.

Figure 4:
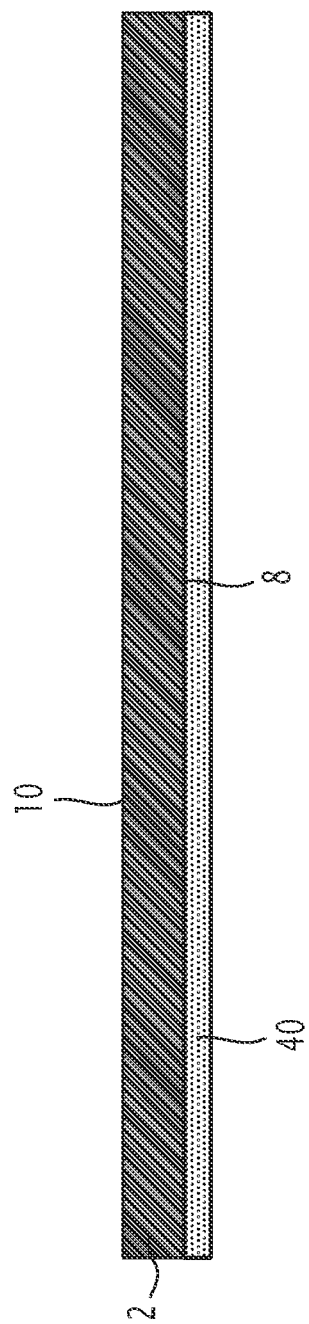
FIG. 4 is a schematic cross-sectional representation of a portion of a functional element during a step in a method of making the trim element.

A method of making a trim element according to an embodiment described above will now be described with reference to FIGS. 4 to 6.

Firstly, a support layer 2 is provided on which a layer of carbon material 40 is deposited. The carbon material layer 40 is deposited on all or part of the inner face 8 or outer face 10 of the support layer 2 depending on the desired function, as described above. In one embodiment, a layer of carbon material 40 is deposited on the inner face 8 and another is deposited on the outer face 10 of the support layer 2. In FIG. 4, the carbon material layer 40 extends over the inner face 8 of the support layer 2, for the purpose of making a pressure sensor, as described with reference to FIGS. 3 and 7. The carbon material layer 40 is deposited, for example, by assembling a mat of carbon fibres and polypropylene fibres from a needle punching process and applying it to the support layer 2. In one embodiment, the carbon material layer 40 is arranged to form a reinforcing layer for the support layer 2.

Figure 5:
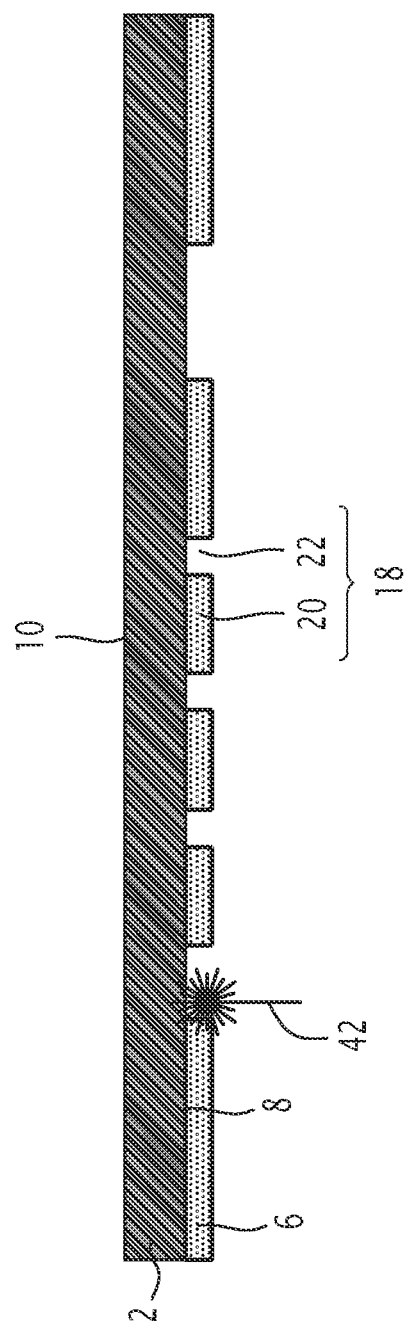
FIG. 5 is a schematic cross-sectional representation of a portion of a functional element during another step in a method of making the trim element.

As shown in FIG. 5, the pattern 18 is then made in the carbon material layer 40. For this purpose, at least one through-opening is formed in the carbon material layer 40 from one face to the other to create the non-conductive area 22. The term "from one face to the other" means that the layer of carbon material 40 is cut through its entire thickness. The shape of the through opening(s) in the carbon material layer 40 define the shape of the pattern 18 and of the conductive area(s) 20 thereof. According to the embodiment shown in FIG. 5, the carbon layer 40 is hollowed out by means of laser radiation 42, thus defining the shape of the pattern 18 very precisely. Alternatively, the layer of carbon material 40 is cut into the carbon material by etching, milling or mechanical drilling. As described above, several patterns 18 can be provided in the functional layer 6.

It is understood that the pattern(s) 18 could also be made prior to the application of the carbon material layer(s) 40 to the support layer 2.

Figure 6:
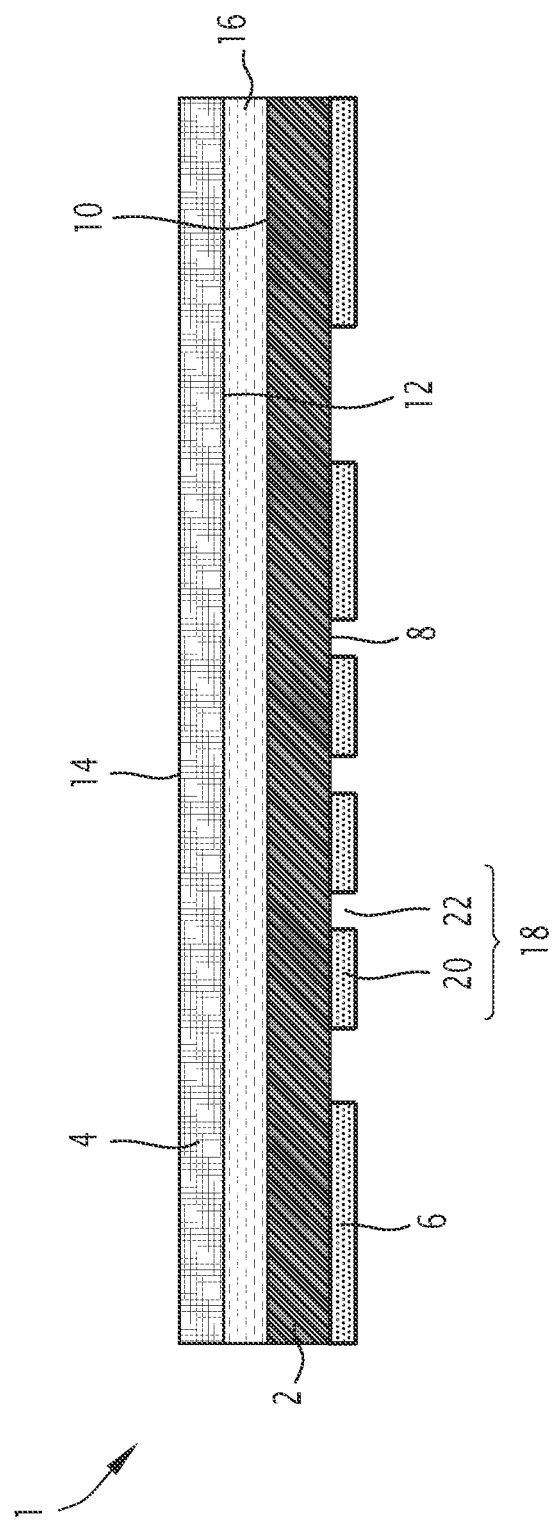
FIG. 6 is a schematic cross-sectional representation of a portion of a functional element during yet another step in a method of making the trim element.

If necessary, the decorative layer 4 is then fixed, for example by gluing, to the support layer 2 and/or the functional layer 6, as shown in FIG. 6.

If necessary, a transparent or translucent coating is applied to the decorative layer 4 or to the support layer 2 and/or to the functional layer 6.

The conductive area(s) 20 are then connected to one or more current sources, for example when the trim element 1 is mounted on the vehicle. When an electrical connector 36 is provided, it is, for example, inserted into a through opening 38 previously made in the support layer 2.

A three-dimensional shaping step of the support layer 2 can be provided to give the trim element the desired shape. This step can be performed before or after the assembly of the decorative layer 4 and/or the application of the coating.

The method is therefore particularly simple and inexpensive to implement. In addition, the pattern(s) 18 can be accurately positioned.

The invention claimed is:

1. A vehicle trim element comprising at least one support layer, comprising an inner face and an outer face, and at least one functional layer made of carbon material extending over at least part of the inner face and/or over at least part of the outer face of the support layer, wherein at least part of said functional layer defines at least one pattern comprising at least one conductive area of carbon material and at least one non-conductive area formed by a through opening in the functional layer, said conductive area being powered by a current source electrically connected to the conductive area, the pattern forming at least part of an electrical circuit arranged to perform an interaction function with a vehicle passenger on an outer surface of the trim element.

2. The trim element according to claim 1, further comprising a decorative layer extending opposite the outer face of the support layer and forming the outer surface of the trim element.

3. The trim element according to claim 1, wherein the outer surface of the trim element is formed by the support layer and/or the functional layer.

4. The trim element according to claim 1, comprising an outer functional layer extending over at least part of the outer face of the support layer and an inner functional layer extending over at least part of the inner face of the support layer, the patterns of the outer and inner functional layers forming a capacitive circuit so as to form a tactile surface on at least part of the outer surface of the trim element.

5. The trim element according to claim 1, wherein the pattern of the functional layer forms a flexible resistive circuit so as to form a pressure sensor on at least part of the outer surface of the trim element.

6. The trim element according to claim 1, comprising an outer functional layer and an inner functional layer, the outer functional layer being separated from the inner functional layer by the support layer or by a flexible layer, the patterns of the outer functional layer and the inner functional layer forming a capacitive circuit whose capacitance varies according to the distance between the outer functional layer and the inner functional layer, said distance varying by reversible compression of the support layer or the flexible layer when pressure is exerted on the outer surface of the trim element.

7. The trim element according to claim 1, wherein the support layer is made of a composite material comprising natural fibres in a polypropylene matrix.

8. The trim element according to claim 1, wherein the pattern is formed in a functional layer extending on the outer face of the support layer, said pattern forming a functional part of an electrical circuit, said electrical circuit comprising a power supply part extending on the inner face of the support layer, said power supply part being electrically connected to the power source and to the functional part of the electrical circuit through the support layer.

9. The trim element according to claim 8, wherein the power supply part is electrically connected to the functional part by at least one connecting element extending into the support layer, said connecting element being formed by a conductive material extending into a through opening formed in the support layer.

10. The trim element according to claim 1, wherein the functional layer forms a grounding area outside the pattern arranged to protect the electrical circuit formed by the pattern and/or another electrical circuit of the trim element from electrostatic discharge.

11. The trim element according to claim 1, wherein the functional layer is formed by a film bonded or laminated to at least a part of the inner face and/or to at least a part of the outer face of the support layer.

12. A method of manufacturing a trim element according to claim 1, comprising the following steps:
providing a support layer,
applying a layer of carbon material to at least part of the outer face and/or at least part of the inner face of the support layer,
cutting the layer of carbon material through its entire thickness so as to form a pattern comprising at least one conductive area of carbon material and at least one non-conductive area formed by a through opening in the layer of carbon material so as to obtain an electrical circuit,
electrically connecting the conductive area of the pattern of the functional layer to a power source.

13. The method of manufacture according to claim 12, in which the layer of carbon material is cut out of the carbon material by laser etching, chemical etching, milling or mechanical drilling.

14. The method of manufacture according to claim 12, wherein the pattern in the carbon material layer is made before and/or after the application of the carbon material layer to the support layer.

* * * * *